United States Patent [19]
Cordell

[11] 4,061,932
[45] Dec. 6, 1977

[54] WINDOW COMPARATOR

[75] Inventor: Robert Roger Cordell, Tinton Falls, N.J.

[73] Assignee: Bell Telephone Laboratories, Incorporated, Murray Hill, N.J.

[21] Appl. No.: 658,744

[22] Filed: Feb. 17, 1976

[51] Int. Cl.$^2$ .................... H03K 5/153; H03K 5/20
[52] U.S. Cl. .................... 307/360; 307/354; 328/146; 328/150; 330/252
[58] Field of Search .......... 307/235 R, 235 E, 235 N, 307/DIG. 3; 330/30 D; 328/146, 149, 150, 115

[56] References Cited

U.S. PATENT DOCUMENTS

| | | | |
|---|---|---|---|
| 3,648,069 | 3/1972 | Frederiksen | 330/30 D |
| 3,699,464 | 10/1972 | Zobel | 330/30 D |
| 3,700,921 | 10/1972 | Gay | 307/235 N |

OTHER PUBLICATIONS

J. A. Chaloupka et al., "Differential Threshold Detector Circuit" IBM Technical Disclosure Bulletin vol. 14, No. 2 July 1971, pp. 401–402.

*Primary Examiner*—John Zazworsky
*Attorney, Agent, or Firm*—Richard B. Havill

[57] ABSTRACT

A family of window comparator circuits are arranged to monitor differential input signals and indicate when the difference between the signals is between two limits. Each of the window comparator circuits includes an input circuit having at least one current source. The input circuit is responsive to a differential input signal for conducting two dependently variable currents through an output circuit. At least one voltage dropping element is connected to each current source in the input circuit for establishing the limits of the window comparator. The output circuit responds to changes in the ratio between the two currents conducted therethrough for indicating that the differential input signal is between the two limits.

15 Claims, 7 Drawing Figures

WINDOW COMPARATOR

BACKGROUND OF THE INVENTION

The invention is a window comparator for determining when an input signal is between two limits.

In the prior art, a window comparator includes a pair of comparison circuits arranged with two pairs of input terminals so that input signals applied to one terminal of each pair are compared with a different fixed reference, or bias, voltage applied to the other terminal of each pair. The input signals therefore are always compared with the fixed reference voltages. Thus the prior art circuitry is single-ended in nature and cannot reject common-mode variations in the input signals while maintaining a fixed difference between the two limits. When implemented in integrated circuit form, the prior art window comparator requires a large area of integrated circuit chip.

SUMMARY OF THE INVENTION

Therefore it is an object of the invention to provide a circuit for indicating when a differential input signal is between two predetermined limits.

It is another object to provide a window comparator without limits established by reference voltages.

It is a further object to provide a window comparator having a consistent difference between the limits of the window regardless of common-mode variations in the differential input signals.

It is a still further object to provide a window comparator which uses a very small area when implemented as an integrated circuit.

These and other objects of the invention are realized by a window comparator circuit which monitors differential input signals and indicates when the difference between the signals is between two limits. The circuit includes an input circuit having at least one current source and being responsive to a differential input signal for conducting two dependently variable currents through an output circuit. At least one voltage dropping element is connected to each current source in the input circuit for establishing the limits of the window comparator. The output circuit responds to changes in the ratio between the two currents conducted therethrough for indicating that the differential input signal is between the two limits.

It is a feature of the invention to connect at least one voltage dropping element to each current source in the input circuit for establishing the limits of the window comparator.

It is another feature to provide an output circuit connected with the input circuit and arranged for responding to changes in the ratio between two dependently variable currents conducted through the output circuit to indicate when the differential input signal is between the two limits.

BRIEF DESCRIPTION OF THE DRAWINGS

The invention may be more fully understood by referring to the following detailed description when that description is read with reference to the attached drawings wherein.

DETAILED DESCRIPTION

Figure 1:
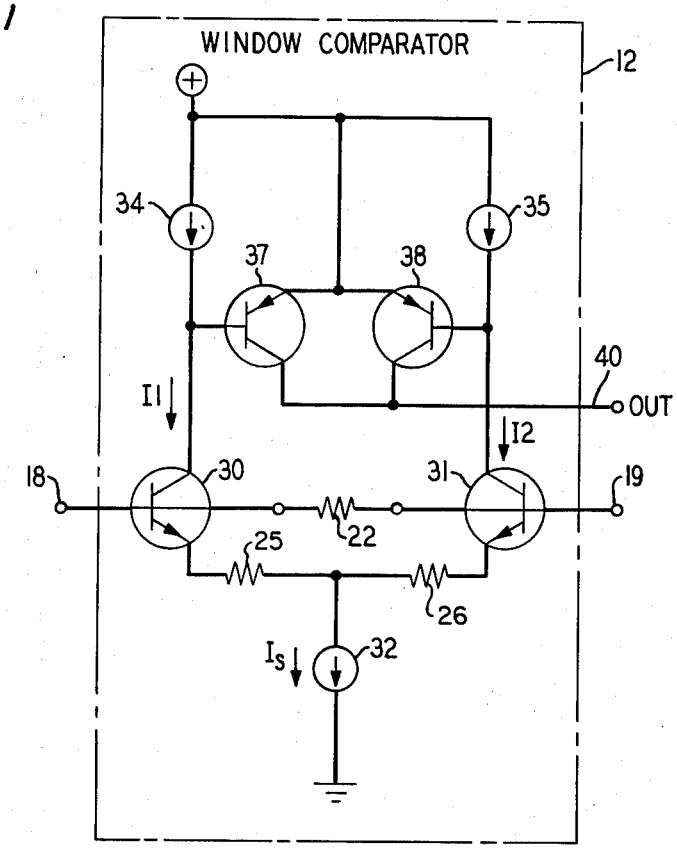
FIG. 1 is a schematic diagram of an embodiment of a window comparator.

Embodiment of FIG. 1

Figure 2:
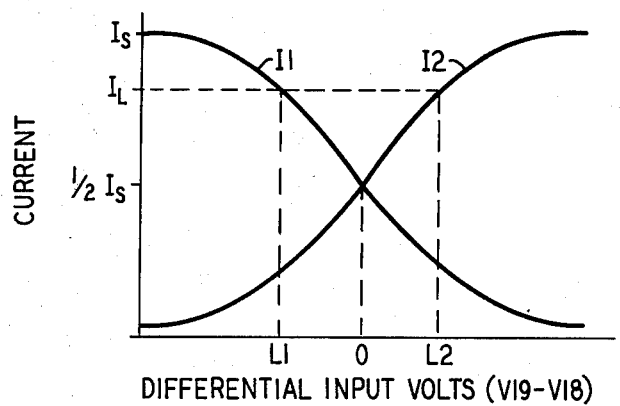
FIGS. 2 and 3 are diagrams depicting operating characteristics of the comparator of FIG. 1.
Figure 3:
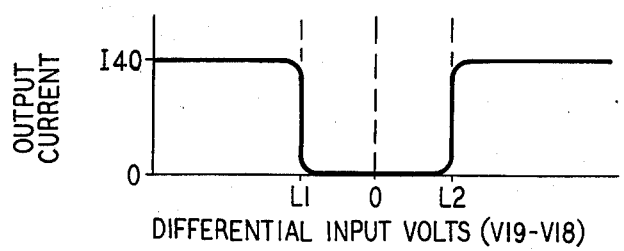

Referring now to FIG. 1, there is shown an exemplary schematic diagram of a window comparator 12 for indicating when a differential input signal is between two predetermined limits L1 and L2, shown in FIGS. 2 and 3. The input signal is applied to the window comparator by way of input terminals 18 and 19 to a differential voltage comparator including transistors 30 and 31. A current source 32 is arranged as an emitter-current sorce for the differential voltage comparator. Current $I_S$ conducted through current source 32 is equal to the sum of collector output currents I1 and I2. The differential voltage comparator includes a pair of resistors 25 and 26 in the emitter paths of the transistors 30 and 31 for establishing a predetermined voltage difference between the limits L1 and L2. A pair of current sources 34 and 35 are connected in the collector output circuits of the transistors 30 and 31, respectively, each of the current sources 34 and 35 includes a transistor arranged to supply $I_L$ units of current. $I_L$ is shown on the vertical axis in FIG. 2. This is more current than the current demanded by either of the associated transistors 30 and 31 when the differential amplifier is balanced and is less than the current $I_S$ conducted through the emitter-current source 32. Under these conditions, the transistors included in the current sources 34 and 35 operate in saturation and a pair of output switching transistors 37 and 38 are disabled.

These output switching transistors are disabled during balanced operation because they lack base drive current. All of the collector current required by the transistors 30 and 31 is supplied by the current sources 34 and 35.

The window comparator operates in response to whatever voltage difference appears between input terminals 18 and 19. If an input signal is a fluctuating current, it can be converted to a differential voltage by conducting the current through an optional resistor 22 connected between the input terminals 18 and 19. Voltage drop created by the current through the resistor 22 then controls the operation of the window comparator.

As shown in FIGS. 2 and 3, the window comparator operates in three different states in response to varying voltage differences between the input terminals 18 and 19. No output current is produced by the window comparator on an output lead 40 when the magnitude of the differential signal is between the predetermined limits. A high level of current I40 is produced on the lead 40 when the magnitude of the differential signal between the input terminals exceeds either of the limits L1 and L2.

In FIGS. 2 and 3 when the voltage difference between the input terminals is zero, the differential voltage comparator is balanced and comparator currents I1 and I2 are equal. Since the differential amplifier is balanced in this state, the transistors included in the current sources 34 and 35 are saturated, and the transistors 37 and 38 are disabled. No output current is conducted through either of the transistors 37 and 38 or the output lead 40. This lack of current in the output lead 40 indicates that the differential input voltage is between the predetermined limits L1 and L2.

When the voltage difference between the input terminals unbalances the differential amplifier including the transistors 30 and 31, unequal currents I1 and I2 are conducted in their collector output circuits. For example, if the unbalance is small enough so that the transistor 30, having a higher input voltage, fails to conduct as much current as its collector current source 34, both of the transistors 37 and 38 remain disabled. This is also true if 31 has a higher input voltage but fails to conduct as much current as current source 35. In both cases, no current is conducted through the lead 40. This condition, like the previously described balanced condition, indicates that the differential input voltage is between the limits L1 and L2 of the window.

When the voltage difference between the input terminals sufficiently unbalances the differential amplifier including the transistors 30 and 31, one of those transistors conducts more current than the transistor load in its collector circuit. Assuming that the input voltage applied to the terminal 19 is sufficiently greater than the voltage applied to the terminal 18 so that the transistor 31 conducts more current than the magnitude $I_L$, the excess current flows through the base-emitter junction of the transistor 38, enabling it to conduct. Transistor 38 then supplies output current I40 through the lead 40 indicating that the differential input voltage is greater than the limit L2 of the window.

Conversely, if the input voltage applied to the terminal 18 is much greater than the voltage applied to the terminal 19 so that transistor 30 conducts more current than the value $I_L$, base-emitter current is drawn through the transistor 37 enabling it to conduct. Transistor 37 supplies output current I40 through the lead 40 indicating that the input voltage difference is greater than the limit L1 of the window.

EMBODIMENT OF FIG. 4

Figure 4:
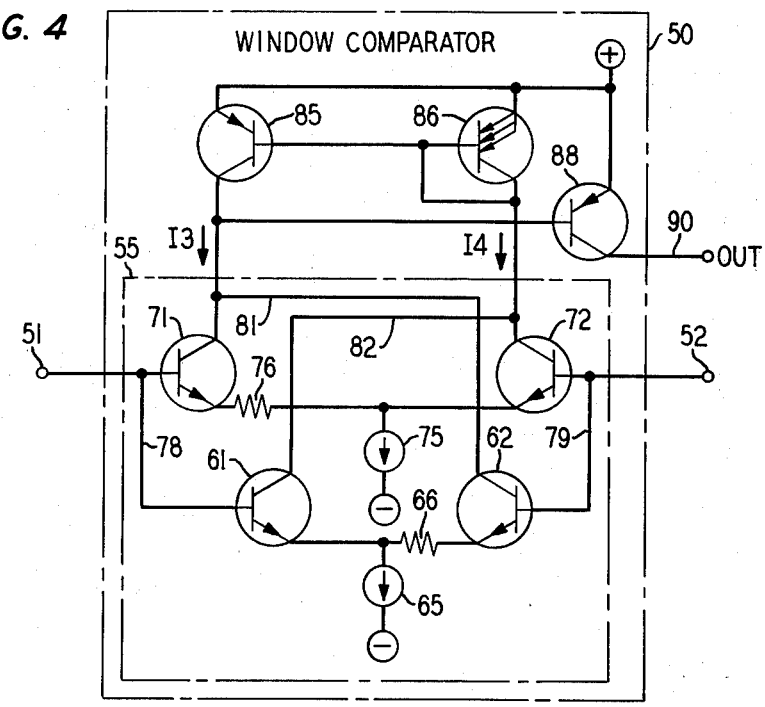
FIG. 4 is a schematic diagram of an alternative embodiment of a window comparator.

Referring now to FIG. 4, there is shown another embodiment of the window comparator for indicating when a differential input signal is between two predetermined limits. Input signals are applied by way of input terminals 51 and 52 to input circuit 44 which includes a pair of interconnected differential-type circuits.

A first one of the differential-type circuits includes transistors 61 and 62 having their emitter circuits connected together to an emitter current source 65. A voltage dropping resistor 66 is connected between the emitter electrode of the transistor 62 and the current source 65, which is directly connected to the emitter electrode of the transistor 61.

A second one of the differential-type circuits includes transistors 71 and 72 having their emitter circuits connected together to another emitter current source 75. Another voltage dropping resistor 76 is connected between the emitter electrode of the transistor 71 and the current source 75, which is directly connected to the emitter electrode of the transistor 72.

The input circuits of the two differential-type circuits are interconnected with each other. A lead 78 connects the base input electrodes of the transistor 61 and 71 with each other and with the input terminal 51. A lead 79 connects base input electrodes of the transistors 62 and 72 with each other and with the input terminal 52.

The outputs of the two differential-type circuits also are interconnected with each other. A lead 81 interconnects the collectors of the transistors 62 and 71. Another lead 82 interconnects the collectors of transistors 61 and 72.

Output currents I3 and I4 of the input circuit are summations of currents conducted through the input circuit 55. Current I3 is a summation of the currents conducted through transistors 71 and 62. Current I4 is a summation of currents conducted through the transistors 61 and 72. These output currents are conducted through an output circuit current mirror including transistor 85 and 86. The emitter of transistor 86 is scaled for conducting approximately three times the current conducted through the transistor 85 at the same current density.

The voltage dropping resistors 66 and 76 are inserted in the emitter paths of transistors 62 and 71 for establishing limits L1 and L2 of the window. The resistance of these resistors in combination with the magnitudes of the currents conducted through the current sources 65 and 75 and the ratio of emitter scaling between transistors 85 and 86 establishes the limits L1 and L2.

Figure 5:
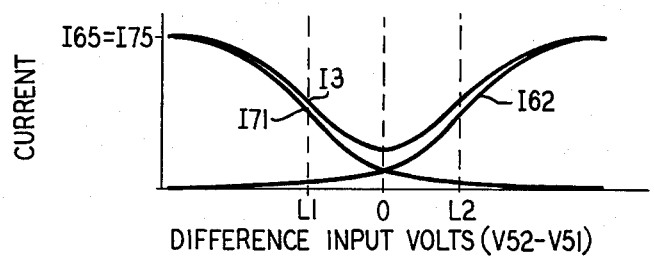
FIGS. 5, 6 and 7 are diagrams showing operating characteristics of the comparator of FIG. 4.
Figure 6:
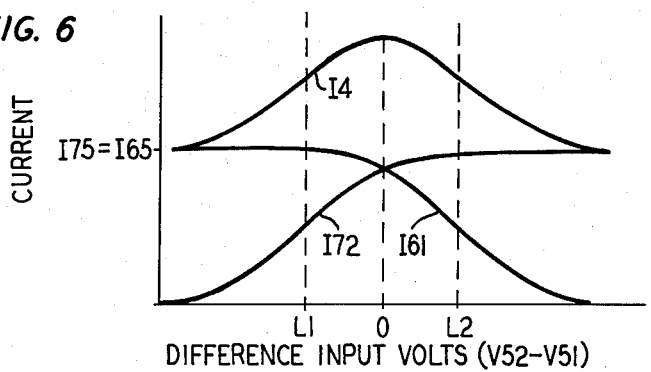
Figure 7:
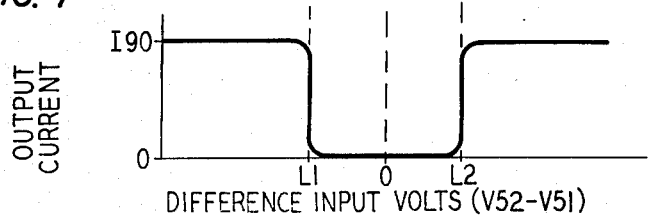

Referring now to FIGS. 5, 6 and 7, the operation of the circuit of FIG. 4 will be explained. It should be noted that the differential input signals applied to the input terminals 51 and 52 are coupled to both of the differential-type circuits. Currents conducted by the transistors 62 and 71 are shown in FIG. 5, and currents conducted by the transistors 61 and 72 are shown in FIG. 6.

FIG. 5 represents the variation of current conducted in the transistors 62 and 71 as the voltage difference between terminals 51 and 52 changes. FIG. 6 represents the variation of current conducted in the transistors 61 and 72 as the voltage difference between terminals 51 and 52 changes. The horizontal scale represents changes in the differential input voltage starting from the left where the terminal 51 is substantially more positive than the terminal 52. Moving to the right along the horizontal, the scale goes through a point representing balanced input voltage, or zero difference. Further to the right, the terminal 52 is substantially more positive than the terminal 51. Accordingly, currents I71 and I61, which are conducted through the transistors 71 and 61, decrease from left to right. Conversely, the currents 62 and 72, which are conducted through the transistors 62 and 72, increase from left to right.

The output current I3, shown as an arrow in FIG. 4, is further shown in FIG. 5 as the summation of the currents I62 and I71. It is noted that the current I3 dips to a minimum between the limits L1 and L2 of the window.

The output current I4, shown as an arrow in FIG. 4, is shown in FIG. 6 as the summation of the currents I61 and I72. It is noted that the current I4 rises to a maximum between the limits L1 and L2.

Referring once again to FIG. 4, there also is shown an output switching transistor 88 that is responsive to changes in the ratio between the currents I3 and I4. Note that the base of transistor 88 is connected to the lead conducting current I3 and that the emitter of transistor 88 is connected to a source of positive potential. The collector of transistor 88 is connected to output lead 90.

The transistor 85 is arranged to operate in saturation and to conduct current required by the transistors 62 and 71 up to a magnitude approximately equal to one-third of current I4. When the input voltage on either one of the input terminals 51 and 52 is much higher than the voltage on the other input terminal, such as at times when the input voltage difference exceeds one or the other of the limits L1 and L2, the magnitude of the current I3 required by the transistors 62 and 71 exceeds one-third of the magnitude of current I4. This causes current to be drawn through the base-emitter path of transistor 88 which conducts an output current I90 as shown in FIG. 7. Between the limits L1 and L2, the voltage on terminals 51 and 52 are relatively close to one another, and the magnitude of current I3 is less than one-third of the magnitude of current I4 established by the transistor 85. As a result, no output current is drawn through the base-emitter path of transistor 88. This lack of output current in transistor 88 is shown in FIG. 7 between the limits L1 and L2.

The output transistor 88 responds as the ratio between the magnitudes of the currents I3 and I4 changes. The output current I90 is high when the ratio I3/I4 is greater than one-third and is low, or zero, when the ratio I3/I4 is less than one-third.

The ratio at which the output transistor 88 switches is a scalar multiple that can be changed in accordance with the reference of the circuit designer. One-third is a convenient multiple for illustrative purposes.

The above-detailed description is illustrative of two embodiments of the invention and it is to be understood that additional embodiments thereof will be obvious to those skilled in the art. The embodiments described herein, together with those additional embodiments, are considered to be within the scope of the invention.

What is claimed is:

1. A window comparator comprising
   an input circuit having a differential circuit with a current source for conducting I units of current and being responsive to a differential input signal for conducting two dependently variable currents through different output sides to an output circuit, the input circuit being arranged for rejecting common-mode input signals,
   the output circuit having a pair of current source loads, each load arranged for conducting a fixed magnitude of current greater than I/2 units of current and connected to a different side of the output of the input circuit, the output circuit being responsive to either side of the input circuit conducting more than the predetermined magnitude of current,
   a pair of voltage dropping elements connected to the current source in the input circuit for establishing two limits of the window comparator, and
   the output circuit connected with the different sides of the input circuit and responsive to changes in the ratio between the two dependently variable currents conducted therethrough for indicating with a single uniform signal when the magnitude of the differential input signal exceeds one of the two limits.

2. A window comparator in accordance with claim 1 wherein the output circuit further comprises a pair of transistors, each transistor having an emitter electrode connected to a common terminal between the current source loads, a base electrode connected separately to a different side of the input circuit, and a collector electrode connected to the collector electrode of the other transistor of the pair of transistors.

3. A window comparator comprising
   an input circuit having a pair of differential circuits interconnected at their inputs and outputs and interconnected with a pair of current sources and being responsive to a differential input signal for conducting two dependently variable currents through different sides to an output circuit, the current sources each for conducting I units of current to a different one of the pair of differential circuits,
   a different voltage dropping element connected to each current source in the input circuit for establishing two limits of the window comparator, and
   the output circuit comprises a current mirror having a pair of conducting paths, each respectively for conducting one of the variable currents from the input circuit, the output circuit being responsive to one side of the input circuit conducting more than a predetermined multiple of the current from the other side for indicating that the magnitude of the differential input signal exceeds one of the two limits.

4. A window comparator in accordance with claim 3 wherein
   the differential circuits in the input circuit include a first and a second differential circuit each having first and second sides for conducting current,
   the input to the first side of each differential circuit being interconnected,
   the input to the second side of each differential circuit being interconnected,
   the output of the first side of the first differential circuit being interconnected with the output of the second side of the second differential circuit,
   the output of the second side of the first differential circuit being interconnected with the output of the first side of the second differential circuit,
   a first resistor being interconnected between a first one of the current sources and the second side of the first differential circuit, and
   a second resistor being interconnected between a second one of the current sources and the first side of the second differential circuit, wherein voltage drop across the first and second resistors establishes the two predetermined limits.

5. A window comparator circuit for monitoring a differential input signal and indicating when the signal exceeds either one of two predetermined limits, the circuit comprising,
   an input circuit including a differential circuit having an output with different sides and a current source for conducting I units of current;
   an output circuit including a pair of current source loads, each load arranged for conducting a predetermined magnitude of current greater than I/2 units of current and connected to a different side of the output of the differential circuit; and
   means responsive to either side of the output of the differential circuit conducting more than the predetermined magnitude of current for indicating that the magnitude of the differential input signal exceeds one of the two predetermined limits.

6. A circuit in accordance with claim 5 wherein the differential circuit includes a pair of resistors arranged for establishing a predetermined voltage difference between the two predetermined limits.

7. A circuit in accordance with claim 5 further comprising voltage dropping means connected between a pair of inputs to the differential circuit for conducting current and causing a voltage difference to unbalance the differential circuit.

8. A window comparator for monitoring a differential input signal and indicating when the signal exceeds either one of two predetermined limits, the circuit comprising an input circuit having a pair of output leads and including a pair of current sources, each source for conducting a predetermined magnitude of current to one of a pair of differential circuits, the first differential circuit having inputs and outputs interconnected respectively with inputs and outputs of the second differential circuit, the input circuit being responsive to the differential input signal for conducting two dependently variable currents through the pair of output leads, an output circuit including a current mirror having a pair of conducting paths, each connected to one of the output leads of the input circuit for conducting one of the variable currents from the input circuit, and means responsive to one output lead of the input circuit conducting a magnitude of current greater than a predetermined multiple of the magnitude of current conducted by the other output lead of the input circuit for indicating that the magnitude of the differential input signal exceeds one of the two limits.

9. A window comparator in accordance with claim 8 wherein the first and second differential circuits, each having first and second sides for conducting current, the input to the first side of each differential circuit being interconnected, the input to the second side of each differential circuit being interconnected, the output of the first side of the first differential circuit being interconnected with the output of the second side of the second differential circuit, the output of the second side of the first differential circuit being interconnected with the output of the first side of the second differential circuit, a first resistor being interconnected between a first one of the current sources and the second side of the first differential circuit, and a second resistor being interconnected between a second one of the current sources and the first side of the second differential circuit, wherein voltage drop across the first and second resistors establishes the two predetermined limits.

10. A window comparator for monitoring a differential input signal and indicating when the signal is between two predetermined limits, the circuit comprising an input circuit having a pair of output leads and including a pair of current sources, each source for conducting a predetermined magnitude of current to one of a pair of differential circuits, the first differential circuit having inputs and outputs interconnected respectively with inputs and outputs of the second differential circuit, the input circuit being responsive to the differential input signal for conducting two dependently variable currents through the pair of output leads, an output circuit including a current mirror having a pair of conducting paths, each connected to one of the output leads of the input circuit for conducting one of the variable currents from the input circuit, and means responsive to one output lead of the input circuit conducting a magnitude of current greater than a predetermined multiple of the magnitude of current conducted by the other output lead of the input circuit for indicating that the magnitude of the differential input signal is between the two predetermined limits.

11. A window comparator in accordance with claim 10 wherein the differential circuits in the input circuit include a first and a second differential circuit each having first and second sides for conducting current, the input to the first side of each differential circuit being interconnected, the input to the second side of each differential circuit being interconnected, the output of the first side of the first differential circuit being interconnected with the output of the second side of the second differential circuit, the output of the second side of the first differential circuit being interconnected with the output of the first side of the second differential circuit, a first resistor being interconnected between a first one of the current sources and the second side of the first differential circuit, and a second resistor being interconnected between a second one of the current sources and the first side of the second differential circuit, wherein voltage drop across the first and second resistors establishes the two predetermined limits.

12. A window comparator comprising an input circut having a pair of differential circuits interconnected at inputs and outputs and interconnected with a pair of current sources and being responsive to a differential input signal for conducting two dependently variable currents through different sides to an output circuit, the current sources each for conducting I units of current to a different one of the pair of differential circuits, a different voltage dropping element connected to each current source in the input circuit for establishing two limits of the window comparator, and the output circuit comprises a current mirror having a pair of conducting paths, each respectively for conducting one of the variable currents from the input circuit, the output circuit being responsive to one side of the input circuit conducting more than a predetermined multiple of the current from the other side for indicating that the magnitude of the differential input signal is between the two predetermined limits.

13. A window comparator in accordance with claim 12 wherein the differential circuits in the input circuit include a first and a second differential circuit each having first and second sides for conducting current, the input to the first side of each differential circuit being interconnected, the input to the second side of each differential circuit being interconnected, the output of the first side of the first differential circuit being interconnected with the output of the second side of the second differential circuit, the output of the second side of the first differential circuit being interconnected with the output of the first side of the second differential circuit, a first resistor being interconnected between a first one of the current sources and the second side of the first differential circuit, and a second resistor being interconnected between a second one of the current sources and the first side of the second differential circuit, wherein voltage drop across the first and second resistors establishes the two predetermined limits.

14. A window comparator comprising an input circuit having a differential circuit with a current source for conducting I units of current and being responsive to a differential input signal for conducting two dependently variable currents through different output sides to an output circuit, the input circuit being arranged for rejecting common-mode input signals, the output circuit having a pair of current source loads, each load arranged for conducting a fixed magnitude of current greater than I/2 units of current and connected to a different side of the output of the input circuit, the output circuit being responsive to either side of the input circuit conducting more than the predetermined magnitude of current, a pair of voltage dropping elements connected to the current source in the input circuit for establishing two limits of the window comparator, and the output circuit connected with the different sides of the input circuit and responsive to changes in the ratio between the two dependently variable currents conducted therethrough for indicating with a single uniform signal when the magnitude of the differential input signal is between the two limits.

15. A window comparator circuit for monitoring a differential input signal and indicating when the signal is between two predetermined limits, the circuit comprising, an input circuit including a differential circuit having an output with different sides and a current source for conducting I units of current;

an output circuit including a pair of current source loads, each load arranged for conducting a predetermined magnitude of current greater than I/2 units of current and connected to a different side of the output of the differential circuit; and means responsive to either side of the output of the differential circuit conducting more than the predetermined magnitude of current for indicating that the magnitude of the differential input signal is between the two predetermined limits.

* * * * *